US009058863B2

(12) United States Patent
Chen et al.

(10) Patent No.: US 9,058,863 B2
(45) Date of Patent: Jun. 16, 2015

(54) REFERENCE FREQUENCY SETTING METHOD, MEMORY CONTROLLER AND MEMORY STORAGE APPARATUS

(71) Applicant: PHISON ELECTRONICS CORP., Miaoli (TW)

(72) Inventors: Chih-Ming Chen, Hsinchu County (TW); An-Chung Chen, Hsinchu (TW)

(73) Assignee: PHISON ELECTRONICS CORP., Miaoli (TW)

( * ) Notice: Subject to any disclaimer, the term of this patent is extended or adjusted under 35 U.S.C. 154(b) by 151 days.

(21) Appl. No.: 13/871,001

(22) Filed: Apr. 26, 2013

(65) Prior Publication Data
US 2014/0241074 A1 Aug. 28, 2014

(30) Foreign Application Priority Data
Feb. 25, 2013 (TW) .............................. 102106544 A

(51) Int. Cl.
G11C 7/22 (2006.01)
G11C 29/02 (2006.01)
G06F 13/16 (2006.01)

(52) U.S. Cl.
CPC ........ G11C 7/222 (2013.01); G11C 2207/2254 (2013.01); G11C 29/023 (2013.01); G11C 29/028 (2013.01); G06F 13/1689 (2013.01)

(58) Field of Classification Search
CPC ............. G11C 16/20; G06F 1/08; G06F 1/04; H03L 7/00

USPC ................. 365/230, 189.07; 711/103; 714/55
See application file for complete search history.

(56) References Cited

U.S. PATENT DOCUMENTS

| 6,937,082 | B2 * | 8/2005 | Ishimi ........................... 327/291 |
| 7,287,199 | B2 * | 10/2007 | Chang ............................. 714/55 |
| 7,583,154 | B1 * | 9/2009 | Kizziar ........................... 331/65 |
| 2008/0309383 | A1 * | 12/2008 | Yada et al. ...................... 327/141 |
| 2009/0106576 | A1 * | 4/2009 | Jacobowitz et al. .......... 713/501 |
| 2010/0095106 | A1 * | 4/2010 | Alexander et al. ................. 713/2 |
| 2010/0244902 | A1 * | 9/2010 | Abouda et al. ................... 327/99 |
| 2012/0254510 | A1 * | 10/2012 | Chen et al. ..................... 711/103 |

* cited by examiner

Primary Examiner — Han Yang
Assistant Examiner — Xiaochun L Chen
(74) Attorney, Agent, or Firm — Jianq Chyun IP Office

(57) ABSTRACT

A reference frequency setting method of a memory storage apparatus including the following steps is provided. A setting code is read from a memory module or a storage unit by a first signal transmission path and stored into a register circuit. The setting code includes a first setting information. Whether the data having a specific frequency is inputted is detected. If not, the setting code stored in the register circuit is read, such that an oscillator circuit module of the memory storage apparatus generates a first reference frequency based on the first setting information. If yes, the setting code stored in the register circuit is updated by a second signal transmission path, and the updated setting code is read, such that the oscillator circuit module generates a second reference frequency based on a second setting information. The updated setting code includes the second setting information.

23 Claims, 8 Drawing Sheets

REFERENCE FREQUENCY SETTING METHOD, MEMORY CONTROLLER AND MEMORY STORAGE APPARATUS

CROSS-REFERENCE TO RELATED APPLICATION

This application claims the priority benefit of Taiwan application serial no. 102106544, filed on Feb. 25, 2013. The entirety of the above-mentioned patent application is hereby incorporated by reference herein and made a part of this specification.

BACKGROUND OF THE DISCLOSURE

1. Field of the Disclosure

The disclosure relates to a reference frequency setting method, and more particularly, to a setting method that records a reference frequency into a memory, and a memory controller and a memory storage apparatus that use the method.

2. Description of Related Art

The universal serial bus (abbreviated USB hereinafter) device is already a very common and mature product in the commercial market. In order to generate a more accurate reference frequency for the operation of the electronic device, an external circuit is often used, that is, a crystal oscillator circuit. In the related art, if the property of the oscillator circuit in the chip needs to be adjusted, the manufacturer usually use a hardware component such as an e-fuse or a trim pad during the open-card process to record the adjustment setting. However, first, the crystal oscillator circuit is expensive, and second, recording the frequency setting of the oscillator circuit in the chip using the method necessarily adds to the hardware size and cost of the USB device. Moreover, after the card is opened, because the hardware component is already blown, the set frequency is hard to modify, which reduces the competitiveness thereof.

In general, the crystal-less oscillator usually requires tracking the frequency of a remote host to generate a more accurate reference frequency. However, under different test modes, the USB device that uses the crystal-less oscillator to generate a reference frequency may not have a frequency from a remote host to track. Therefore, when there is no frequency from a remote host to track, the reference frequency generated by the crystal-less oscillator may be less accurate, which causes the USB device to not be able to satisfy specific test specifications.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY OF THE DISCLOSURE

The disclosure provides a reference frequency setting method for a rewritable non-volatile memory storage apparatus. The reference frequency generated by the setting method may satisfy different test specifications.

The disclosure provides a memory controller. The memory controller controls the memory storage apparatus by the setting method above, such that the reference frequency generated by the memory storage apparatus may satisfy different test specifications.

The disclosure provides a rewritable non-volatile memory storage apparatus. The reference frequency generated by the rewritable non-volatile memory storage apparatus may satisfy different test specifications.

An exemplary embodiment of the disclosure provides a reference frequency setting method for a rewritable non-volatile memory storage apparatus. The rewritable non-volatile memory storage apparatus includes a rewritable non-volatile memory module, a storage unit, and an oscillator circuit module. The oscillator circuit module includes a register circuit. The rewritable non-volatile memory storage apparatus does not include a crystal oscillator. The reference frequency setting method includes the following steps: reading a setting code from the rewritable non-volatile memory module or the storage unit by a first signal transmission path and storing the setting code into the register circuit, wherein the setting code includes a first setting information; detecting whether a data having a first frequency is inputted; if the data having the first frequency is not inputted, reading the setting code stored in the register circuit, such that the oscillator circuit module generates a first reference frequency based on the first setting information of the setting code; if the data having the first frequency is inputted, updating the setting code stored in the register circuit by a second signal transmission path, wherein the updated setting code includes a second setting information; and if the data having the first frequency is inputted, reading the updated setting code stored in the register circuit, such that the oscillator circuit module generates a second reference frequency based on the second setting information.

An exemplary embodiment of the disclosure provides a memory controller. The memory controller is configured to set a reference frequency for a rewritable non-volatile memory storage apparatus. The rewritable non-volatile memory storage apparatus includes a rewritable non-volatile memory module and an oscillator circuit module. The oscillator circuit module includes a register circuit. The memory controller includes a memory interface, a memory management circuit, and a storage unit. The memory interface is coupled to the rewritable non-volatile memory module. The memory management circuit is coupled to the memory interface. The storage unit is coupled to the memory management circuit. The memory management circuit controls the oscillator circuit module to read a setting code from the rewritable non-volatile memory module or the storage unit and store the setting code into the register circuit by a first signal transmission path. The setting code includes a first setting information. The memory management circuit detects whether the data having a first frequency is inputted. If the data having the first frequency is not inputted, the memory management circuit controls the oscillator circuit module to read the setting code stored in the register circuit, such that the oscillator circuit module generates a first reference frequency based on the first setting information of the setting code. If the data having the first frequency is inputted, the memory management circuit controls the oscillator circuit module to update the setting code stored in the register circuit by a second signal transmission path. The updated setting code includes a second setting info illation. If the data having the first frequency is inputted, the memory management circuit controls the oscillator circuit module to read the updated setting code stored in the register circuit such that the oscillator circuit module generates a second reference frequency based on the second setting information.

An exemplary embodiment of the disclosure provides a rewritable non-volatile memory storage apparatus. The rewritable non-volatile memory storage apparatus includes an oscillator circuit module, a rewritable non-volatile memory module, and a memory controller. The oscillator circuit module includes a register circuit. The memory controller is coupled to the oscillator circuit and the rewritable non-volatile memory module. The memory controller includes a storage unit. The memory controller controls the oscillator circuit module to read a setting code from the rewritable non-volatile memory module or the storage unit by the first signal transmission path and store the setting code into the register circuit. The setting code includes a first setting information. The memory controller detects whether a data having a first frequency is inputted. If the data having the first frequency is not inputted, the memory controller controls the oscillator circuit module to read the setting code stored in the register circuit such that the oscillator circuit module generates a first reference frequency based on the first setting information of the setting code. If the data having the first frequency is inputted, the memory controller controls the oscillator circuit module to update the setting code stored in the register circuit by a second signal transmission path. The updated setting code includes a second setting information. If the data having the first frequency is inputted, the memory controller controls the oscillator circuit module to read the updated setting code stored in the register circuit such that the oscillator circuit module generates a second reference frequency based on the second setting information.

Based on the above, in exemplary embodiments of the disclosure, the memory storage apparatus records the adjusted setting of the reference frequency in the memory or the storage unit thereof. Under different test modes, the memory storage apparatus optionally decides whether to start the function of frequency tracking in order to generate reference frequencies that satisfy different test specifications.

To make the above features and advantages of the present disclosure more comprehensible, several embodiments accompanied with drawings are described in detail as follows.

It should be understood, however, that this Summary may not contain all of the aspects and embodiments of the present disclosure, is not meant to be limiting or restrictive in any manner, and that the disclosure as disclosed herein is and will be understood by those of ordinary skill in the art to encompass obvious improvements and modifications thereto.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1A:
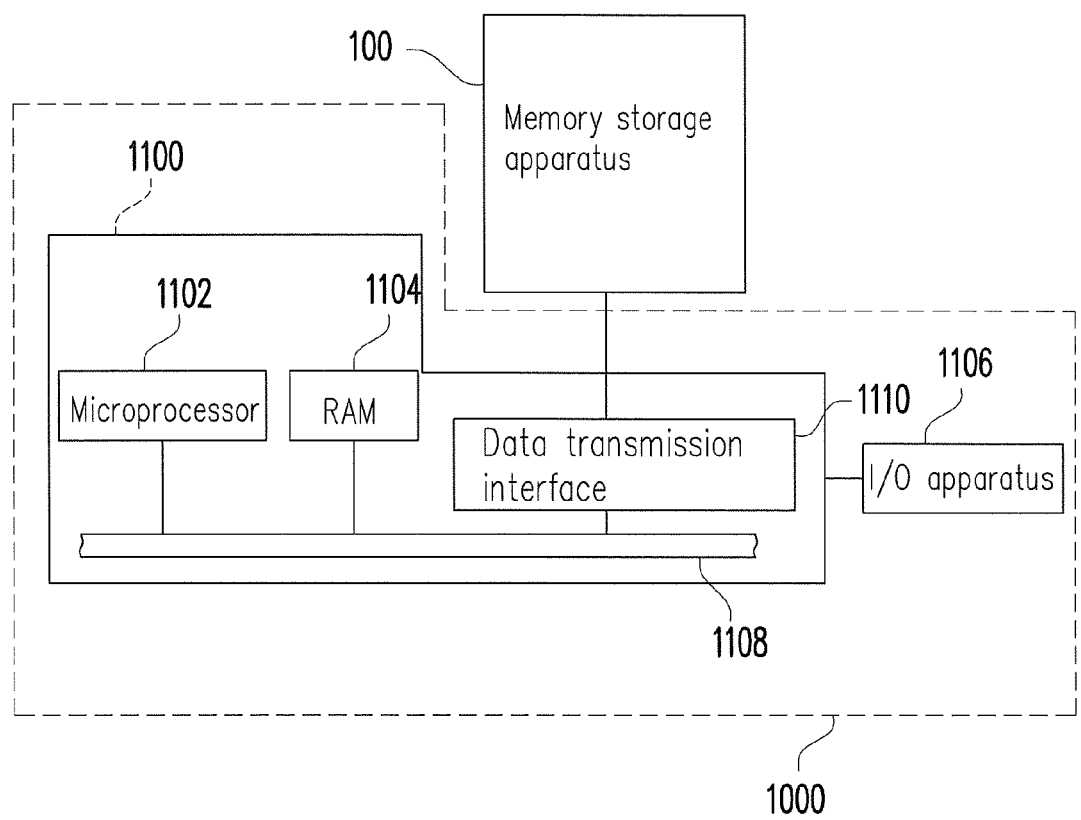
FIG. 1A is a host system and a memory storage apparatus illustrated according to an exemplary embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In an exemplary embodiment of the disclosure, the reference frequency setting method provided records an adjustment setting of a reference frequency in a rewritable non-volatile memory or a storage unit of a memory storage apparatus. During an open-card process, the memory storage apparatus may provide an accurate reference frequency through a host system and directly store a setting value of the reference frequency therein. Alternatively, the memory storage apparatus may track the reference frequency provided by the host system by a frequency tracking method to adjust a frequency setting needed for an oscillator circuit module in a chip thereof. The setting value of the reference frequency is stored in a firmware form into the rewritable non-volatile memory module or the storage unit to be used as an initial frequency value for the next startup. In this way, the difference between the reference frequency of the oscillator circuit module and the host frequency is reduced. As a result, the memory storage apparatus may be accurately connected with the host at startup under normal operation. In addition to operating in normal operation, the memory storage apparatus may also need to satisfy the specifications demanded by different test modes, such as the compliance test mode specification or the loopback test mode specification. In a different test mode, the test conditions and environment may both be different. For instance, during the compliance test, the host or testing device connected with the memory storage apparatus does not provide an external signal to the memory storage apparatus. In this case, the oscillator circuit module of the memory storage apparatus does not have a reference frequency to track. On the other hand, during the loopback test, the host or testing device connected with the memory storage apparatus provides an external signal to the memory storage apparatus. In this case, the oscillator circuit module of the memory storage apparatus may continuously track the frequency of the external signal, such that the setting value for the reference frequency of the oscillator circuit module is dynamically updated.

Accordingly, in an exemplary embodiment of the disclosure, the reference frequency setting method provided not only may store the setting of the initial frequency value in a firmware form into the rewritable non-volatile memory module or the storage unit, but may also decide whether to perform the function of frequency tracking based on the environment of the operation of the memory storage apparatus. In order to more clearly understand the disclosure, figures accompanied by one exemplary embodiment are explained in detail below.

Generally, a memory storage apparatus (also known as a memory storage system) includes a rewritable non-volatile memory module and a controller (also known as a control circuit). The memory storage apparatus is usually configured together with a host system, such that the host system may write data into or read data from the memory storage device.

FIG. 1A is a host system and a memory storage apparatus illustrated according to an exemplary embodiment of the disclosure.

Figure 1B:
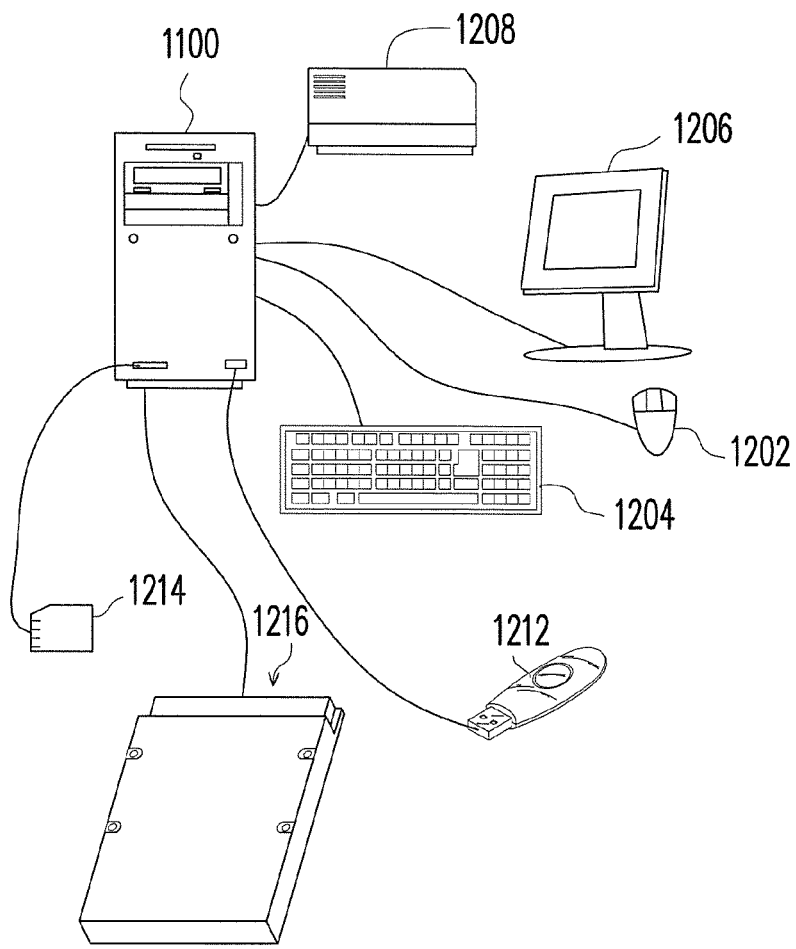
FIG. 1B is a schematic diagram of a computer, an input/output apparatus, and a memory storage apparatus illustrated according to an exemplary embodiment of the disclosure.

Referring to FIG. 1A, a host system 1000 includes a computer 1100 and an input/output (I/O) device 1106. The computer 1100 includes a microprocessor 1102, a random access memory (RAM) 1104, a system bus 1108, and a data transmission interface 1110. The I/O device 1106 includes a mouse 1202, a keyboard 1204, a display 1206, and a printer 1208 as shown in FIG. 1B. It should be understood that the devices illustrated in FIG. 1B are not intended to limit the I/O device 1106, and the I/O device 1106 may further include other devices.

In an embodiment of the disclosure, a memory storage apparatus 100 is coupled to the other devices of the host system 1000 through a data transmission interface 1110. By using the microprocessor 1102, the random access memory (RAM) 1104, and the Input/Output (I/O) device 1106, data may be written into the memory storage apparatus 100 or read from the memory storage apparatus 100. For instance, the memory storage apparatus 100 may be a rewritable non-volatile memory storage apparatus such as a flash drive 1212, a memory card 1214, or a solid state drive (SSD) 1216 as shown in FIG. 1B.

Figure 1C:
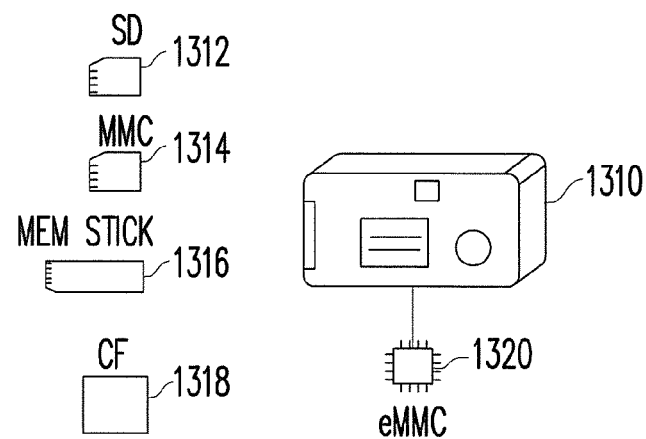
FIG. 1C is a schematic diagram of a host system and a memory storage apparatus illustrated according to another exemplary embodiment of the disclosure.

Generally, the host system 1000 may substantially be any system capable of storing data with the memory storage apparatus 100. Although the host system 1000 is described as a computer system in the present exemplary embodiment, in another exemplary embodiment of the disclosure, the host system 1000 may be a system such as a digital camera, a video camera, a communication device, an audio player, or a video player. Alternatively, the host system 1000 may be the host that provides the reference frequency to the memory storage apparatus 100 during the execution of the open-card process. For instance, if the host system is a digital camera (video camera) 1310, the rewritable non-volatile memory storage apparatus may be an SD card 1312, an MMC card 1314, a memory stick 1316, a CF card 1318, or an embedded storage apparatus 1320 (as shown in FIG. 1C). The embedded storage apparatus 1320 includes an embedded MMC (eMMC). It should be mentioned that the eMMC is directly coupled to a substrate of the host system. When the memory storage apparatus 100 is being tested, the host system 1000 may also indicate the testing device for testing the memory storage apparatus 1000, such as the biterror analyzer.

Figure 2:
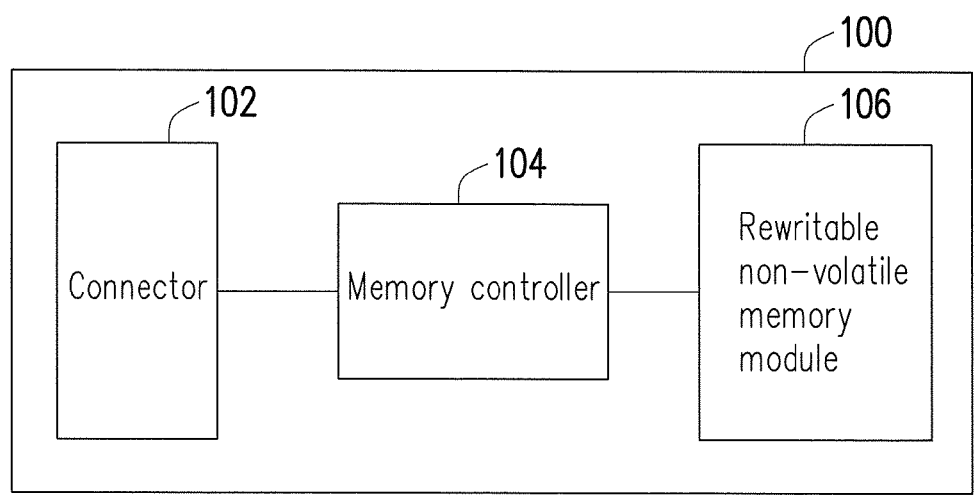
FIG. 2 is a schematic block diagram of the memory storage apparatus in FIG. 1A.

FIG. 2 is a schematic block diagram of the memory storage apparatus in FIG. 1A.

Referring to FIG. 2, the memory storage apparatus 100 includes a connector 102, a memory controller 104, and a rewritable non-volatile memory module 106.

In the present exemplary embodiment, the connector 102 is compatible with the universal serial bus (USB) standard. However, it should be understood that, the disclosure is not limited thereto, and the connector 102 may also satisfy the Institute of Electrical and Electronic Engineers (IEEE) 1394 standard, peripheral component interconnect express (PCI express) interface standard, serial advanced technology attachment (SATA) standard, secure digital (SD) interface standard, Ultra High Speed-I (UHS-I) interface standard, Ultra High Speed-II (UHS-II) interface standard, memory stick (MS) interface standard, multi media card (MMC) interface standard, embedded multimedia card (eMMC) interface standard, Universal Flash Storage (UFS) interface standard, compact flash (CF) interface standard, integrated device electronics (IDE) interface standard, or other suitable standards.

The memory controller 104 is configured to execute a plurality of logic gates or control commands implemented in a hardware form or in a firmware form. The memory controller 104 also performs data operations such as writing, reading, and erasing in the rewritable non-volatile memory storage module 106 based on the commands of the host 1000. It is noted that, in an exemplary embodiment of the disclosure, a reference frequency used in each of the connector 102 and the memory controller 104 adjusts the oscillator circuit module on the inside by a packet information transmitted from the host system 1000 in order to generate the reference frequency. The reference frequency does not come from a crystal oscillator inside the memory storage apparatus 100. Moreover, in another exemplary embodiment of the disclosure, the memory storage apparatus 100 does not contain a crystal oscillator on the inside.

The rewritable non-volatile memory module 106 is coupled to the memory controller 104 and is configured to store data written from the host system 1000. In the present exemplary embodiment, the rewritable non-volatile memory module 106 is a multi level cell (MLC) NAND flash memory module. However, the disclosure is not limited thereto, and the rewritable non-volatile memory module 106 may also be a single level cell (SLC) NAND flash memory module, other flash memory modules, or other memory modules having the same features.

Figure 3:
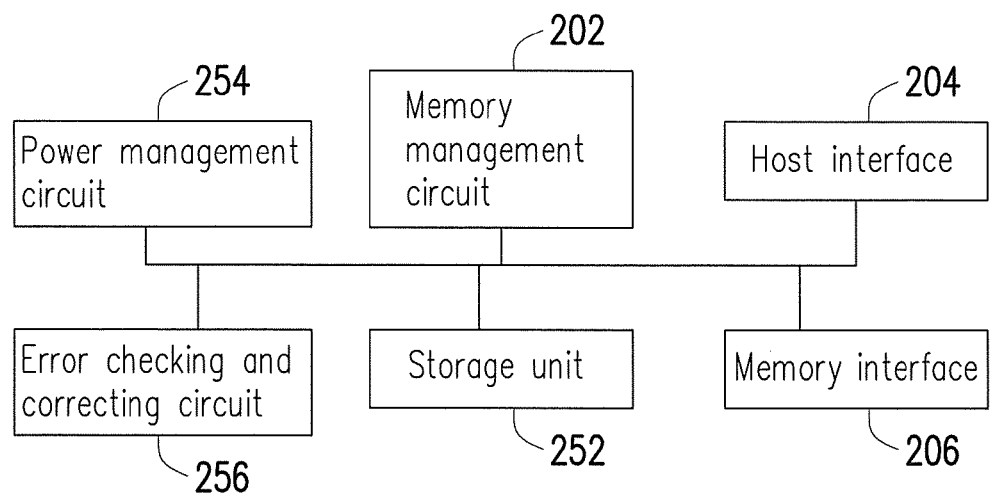
FIG. 3 is a schematic block diagram of a memory controller illustrated according to an exemplary embodiment of the disclosure.

FIG. 3 is a schematic block diagram of a memory controller illustrated according to an exemplary embodiment of the disclosure.

Referring to FIG. 3, the memory controller 104 includes a memory management circuit 202, a host interface 204, and a memory interface 206.

The memory management circuit 202 is configured to control the overall operation of the memory controller 104. Specifically, the memory management circuit 202 has a plurality of control commands. During the operation of the memory storage apparatus 100, the control commands are executed to perform various data operations such as writing, reading, and erasing.

In the present exemplary embodiment, the control commands of the memory management circuit 202 are implemented in a firmware form. For instance, the memory management circuit 202 has a microprocessor unit (not illustrated) and a read-only memory (not illustrated), and the control commands are burned into the read-only memory. During the operation of the memory storage apparatus 100, the control commands are executed by the microprocessor unit to perform data operations such as writing, reading, and erasing.

In another exemplary embodiment of the disclosure, the control commands of the memory management circuit 202 may also be stored in the form of program codes into a specific area (for instance, the system area in a memory module exclusively configured to store system data) of the rewritable non-volatile memory module 106. In addition, the memory management circuit 202 has a microprocessor unit (not illustrated), a read-only memory (not illustrated), and a random-access memory (not illustrated). In particular, the read-only memory has an activation code, and when the memory controller 104 is enabled, the microprocessor unit first executes the activation code to load the control commands stored in the rewritable non-volatile memory module 106 into the random-access memory of the memory management circuit 202. Next, the control commands are executed by the microprocessor unit to perform data operations such as writing, reading, and erasing. Further, in another exemplary embodiment of the disclosure, the control commands of the memory management circuit 202 may also be implemented in a hardware form.

The host interface 204 is coupled to the memory management circuit 202 and is configured to receive and identify commands and data sent from the host system 1000. Specifically, the commands and data sent from the host system 1000 are transmitted to the memory management circuit 202 through the host interface 204. In the present exemplary embodiment, the host interface 204 is compatible with the USB standard. However, it should be understood that the disclosure is not limited thereto, and the host interface 204 may also be compatible with the SATA standard, IEEE 1394 standard, PCI Express standard, SD standard, UHS-I interface standard, UHS-II interface standard, MS standard, MMC standard, eMMC interface standard, UFS interface standard, CF standard, IDE standard, or other suitable standards for data transmission.

The memory interface 206 is coupled to the memory management circuit 202 and is configured to access the rewritable non-volatile memory module 106. That is, data to be written to the rewritable non-volatile memory module 106 is converted to a memory acceptable to the rewritable non-volatile memory module 106 through the memory interface 206.

In an exemplary embodiment of the disclosure, the memory controller 104 further includes a storage unit 252. The storage unit 252 is coupled to the memory management circuit 202 and may be configured to store system data and temporarily store data and commands from the host system 1000 or data from the rewritable non-volatile memory module 106.

In an exemplary embodiment of the disclosure, the memory controller 104 further includes a power management circuit 254. The power management circuit 254 is coupled to the memory management circuit 202 and is configured to control the power of the memory storage apparatus 100.

In an exemplary embodiment of the disclosure, the memory controller 104 further includes an error checking and correcting circuit 256. The error checking and correcting circuit 256 is coupled to the memory management circuit 202 and is configured to perform an error checking and correcting process to ensure the correctness of data. Specifically, when the memory management circuit 202 receives a writing command from the host system 1000, the error checking and correcting circuit 256 generates an error checking and correcting code (ECC code) for the data corresponding to the writing command, and the memory management circuit 202 writes the data and ECC code corresponding to the writing command into the rewritable non-volatile memory module 106. Next, when reading data from the rewritable non-volatile memory module 106, the memory management circuit 202 also reads the ECC code corresponding to the data, and the error checking and correcting circuit 256 performs an error checking and correcting process on the read data based on the ECC code.

Figure 4:
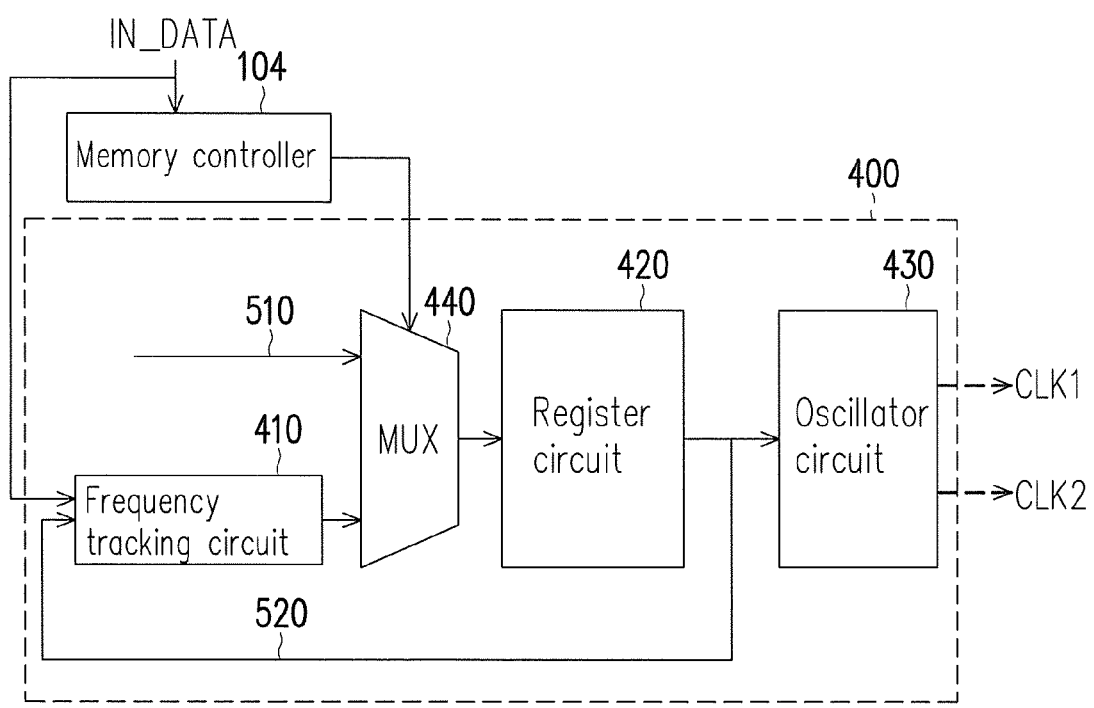
FIG. 4 is a schematic block diagram of an oscillator circuit module illustrated according to an exemplary embodiment of the disclosure.

FIG. 4 is a schematic block diagram of an oscillator circuit module illustrated according to an exemplary embodiment of the disclosure. Referring to FIG. 2 to FIG. 4, in the present embodiment, an oscillator circuit module 400 is an oscillator circuit module in a chip designed in the inside of the memory storage apparatus 100, and is, for instance, disposed in the connector 102 to generate first or second reference frequencies CLK1 and CLK2. In the present exemplary embodiment, the oscillator circuit module 400 includes a frequency tracking circuit 410, a register circuit 420, an oscillator circuit 430, and a selector circuit 440. The oscillator circuit 430 is, for instance, an RC oscillator, a ring oscillator, or an LC oscillator. In the present embodiment, the oscillator circuit 430 may generate the first or second reference frequencies CLK1 and CLK2 based on a setting information of a reference frequency stored in the register circuit 420. The register circuit 420 is configured to store the setting information of the reference frequency.

Figure 5:
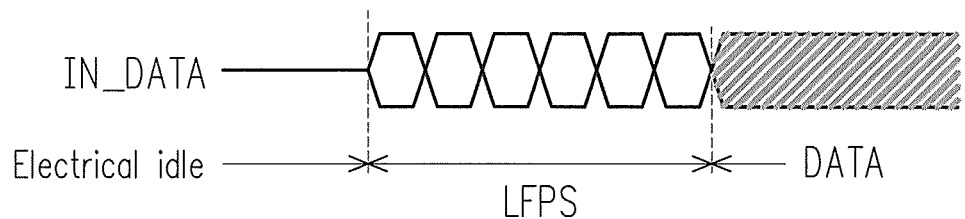
FIG. 5 and FIG. 6 individually illustrate a possible schematic waveform for an input data according to an exemplary embodiment of the disclosure.
Figure 6:
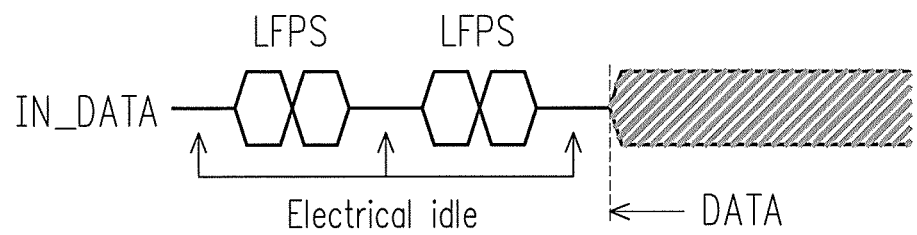

In the present exemplary embodiment, the memory management circuit 202 inside the memory controller 104 may be configured to detect whether the memory storage apparatus 100 received an input data IN_DATA or whether the input data IN_DATA received includes a data having a first frequency. That is, the memory controller 104 may detect whether the data having the first frequency is inputted into the memory storage apparatus 100. FIG. 5 and FIG. 6 individually illustrate a possible schematic waveform for the input data IN_DATA of the present exemplary embodiment. Referring to both FIG. 5 and FIG. 6, in the present exemplary embodiment, the input signal IN_DATA usually includes a low frequency period signal (LFPS), a data signal DATA, and an electrical idle. The low frequency period signal is, for instance, the data having the first frequency in the input signal IN_DATA, used as a data having a specific frequency for the memory controller 104 in deciding whether to perform frequency tracking, and may be distributed in a continuous or discontinuous manner in the input signal IN_DATA, as individually shown in FIG. 5 and FIG. 6. The low frequency period signal is a low frequency signal, and the period thereof is between about 20 nanoseconds (ns) and 100 ns. In the present exemplary embodiment, the data signal DATA is, for instance, a data having a second frequency in the input signal IN_DATA, and is used as a target signal for the frequency tracking circuit 410 in performing frequency tracking, wherein the frequency is generally 5 gigahertz (GHz). Therefore, in this example, the memory controller 104 may detect whether the low frequency period signal is inputted into the memory storage apparatus 100. However, the low frequency period signal used as a data having a specific frequency for the memory controller 104 in deciding whether to perform frequency tracking is only illustrated as an example, and is not limited by the disclosure.

Figure 7:
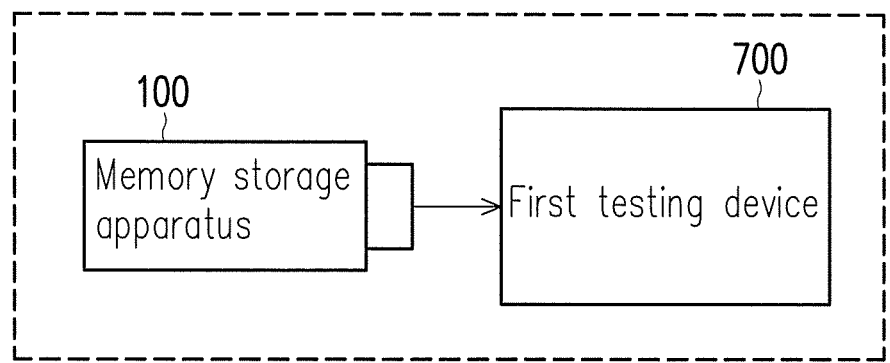
FIG. 7 illustrates a schematic diagram of a memory storage apparatus coupled to a first testing device in a first test mode.
Figure 8:
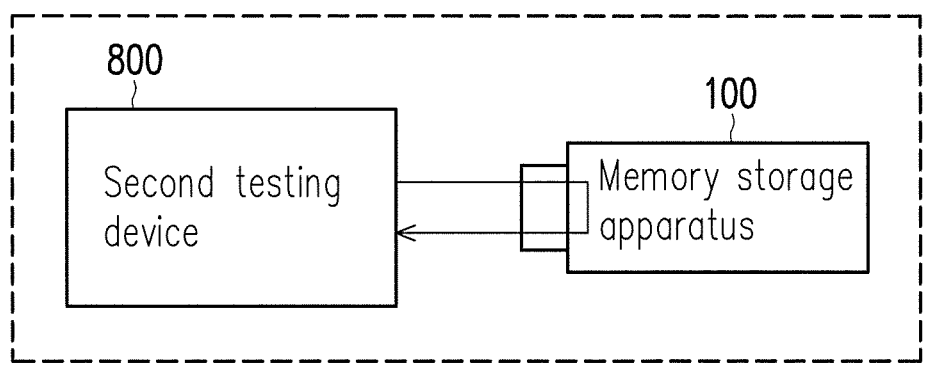
FIG. 8 illustrates a schematic diagram of a memory storage apparatus coupled to a second testing device in a second test mode.

The memory storage apparatus 100 of the present exemplary embodiment may be operated in normal operation and different test modes, including a first test mode and a second test mode. In the first test mode, for instance, the compliance test mode, a first testing device 700 coupled to the memory storage apparatus 100 does not provide an external signal to the memory storage apparatus 100, as shown in FIG. 7. FIG. 7 illustrates a schematic diagram of the memory storage apparatus coupled to the first testing device in the first test mode. In the first test mode, the memory controller 104 does not detect the input of the low frequency period signal to the memory storage apparatus 100 during the compliance test. In the second test mode, for instance, the feedback test mode, a second testing device 800 coupled to the memory storage apparatus 100 performs a biterror test (BERT) to the memory storage apparatus 100, as shown in FIG. 8. FIG. 8 illustrates a schematic diagram of the memory storage apparatus coupled to the second testing device in the second test mode. In the second test mode, the second testing device 800 may output the input signal IN_DATA to the memory storage apparatus 100 for testing, wherein the input signal IN_DATA includes the low frequency period signal having the first frequency and the data signal DATA having the second frequency.

In an exemplary embodiment of the disclosure, in order to satisfy different test specifications, before the memory storage apparatus 100 is tested, the memory controller 104 controls the selector circuit 440 to select and conduct the first signal transmission path 510, such that the oscillator circuit module 400 is controlled to read the setting code from the rewritable non-volatile memory module 106 or the storage unit 252 by the first signal transmission path 510. The memory controller 104 also controls the oscillator circuit module 400 to store the setting code into the register circuit 420.

In an embodiment, the setting code stored into the register circuit 420 by the first signal transmission path 510 may include a first setting information and a second setting information. In the first test mode, the memory controller 104 does not start the frequency tracking circuit 410. Accordingly, the oscillator circuit 430 generates the first reference frequency CLK1 based on the first setting information stored in the register circuit 420 to satisfy the test specification of the first test mode. In the second test mode, if the memory controller 104 detects the data having the first frequency, such as the low frequency period signal above, then the memory controller 104 may start the frequency tracking circuit 410, such that the frequency tracking circuit 410 updates the second setting information stored in the register circuit 420 based on a test frequency provided by the second testing device 800. Accordingly, under different test modes, the first reference frequency CLK1 or the second reference frequency CLK2 of the oscillator circuit 430 independently generated based on the first setting information or the second setting information may individually satisfy the test specification of each of the first test mode and the second test mode.

Figure 9:
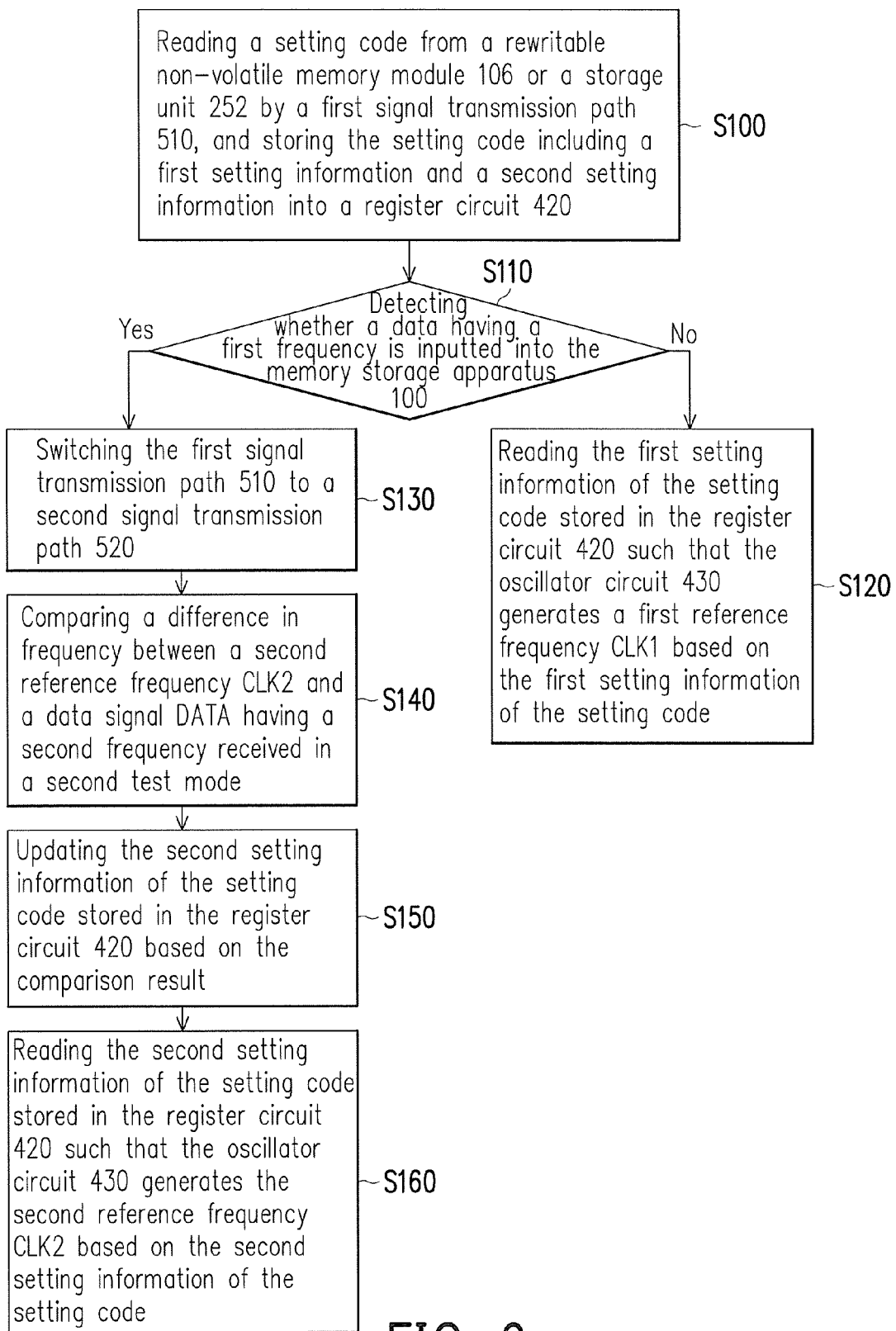
FIG. 9 is a flowchart of a reference frequency setting method illustrated according to an exemplary embodiment of the disclosure.

FIG. 9 is specifically a flowchart of a reference frequency setting method illustrated according to an exemplary embodiment of the disclosure. Referring to FIG. 9, in the present embodiment, in step S100, the memory controller 104 controls the selector circuit 440 such that by selecting the conducting first signal transmission path 510, the oscillator circuit module 400 reads the setting code from the rewritable non-volatile memory module 106 or the storage unit 252 by the first signal transmission path 510 and stores the setting code into the register circuit 420. In this step, the memory controller 104, for instance, first sets the first setting information and the second setting information of the setting code based on the frequency of the host system 1000, and then stores the setting code in a firmware form into the rewritable non-volatile memory module 106 or the storage unit 252. Therefore, in the present embodiment, the setting code stored in the rewritable non-volatile memory module 106 or the storage unit 252 includes the first setting information and the second setting information. Then, in step S110, the memory controller 104 detects whether the data having the first frequency is inputted into the memory storage apparatus 100. If not, the reference frequency setting method of the present embodiment executes step S120. From another perspective, if the memory controller 104 did not detect the input of the data having the first frequency to the memory storage apparatus 100, then it is indicated that at this point the memory storage apparatus 100 is in the state of the first test mode. In step S120, the memory controller 104 controls the oscillator circuit 430 such that by reading the first setting information stored in the register circuit 420, the oscillator circuit 430 generates the first reference frequency CLK1 based on the first setting information of the setting code. Therefore, in the first test mode, the first reference frequency CLK1 of the oscillator circuit 430 generated based on the first setting information of the setting code satisfies the specification of the first test mode. Moreover, in the first test mode, the memory controller 104 does not start the frequency tracking circuit 410 to execute the operation of frequency tracking.

On the other hand, in step S110, if the memory controller 104 detects the input of the data having the first frequency to the memory storage apparatus 100, then it is indicated that at this point the memory storage apparatus 100 is in the state of the second test mode or the state of normal operation and the reference frequency setting method of the present embodiment will execute step S130. In step S130, the memory controller 104 controls the selector circuit 440 such that the first signal transmission path 510 is switched to a second signal transmission path 520, the frequency tracking circuit 410 is started, and the setting code stored in the register circuit 420 may be updated by the second signal transmission path 520. Then, in step S140, the frequency tracking circuit 410 compares the difference in frequency between the second reference frequency CLK2 and the data signal DATA having the second frequency received in the second test mode. Next, in step S150, the memory controller 104 updates the second setting information of the setting code stored in the register circuit 420 based on the comparison result. It should be mentioned that, in the present embodiment, because the rewritable non-volatile memory module 106 or the storage unit 252 stores the first setting information and the second setting information of the setting code, the setting code includes the second setting information before update. Next, in step S160, the memory controller 104 controls the oscillator circuit 430 such that by reading the second setting information of the setting code stored in the register circuit 420, the oscillator circuit 430 generates the second reference frequency CLK2 based on the second setting information of the setting code. Therefore, in the second test mode, the second reference frequency CLK2 of the oscillator circuit 430 generated based on the second setting information of the setting code satisfies the specification of the second test mode.

Moreover, in the present embodiment, after the step S150 of updating the second setting information of the setting code stored in the register circuit 420 is executed, the memory controller 104 may also update the setting code stored in the rewritable non-volatile memory module 106 or the storage unit 252 based on the comparison result of step S150.

Moreover, sufficient teaching, suggestion, and implementation illustration of the details of other implementations of the reference frequency setting method of the present embodiment may be obtained from descriptions of the embodiments of FIG. 1 to FIG. 8, and are not described herein.

In another embodiment, the setting code read from the rewritable non-volatile memory module 106 or the storage unit 252 and stored into the register circuit 420 by the first signal transmission path 510 may also only include the first setting information. In this example, the memory controller 104 sets the first setting information of the setting code based on the frequency of the host system 1000 and stores the setting code that currently only includes the first setting information into the rewritable non-volatile memory module 106 or the storage unit 252. In the first test mode, the memory controller 104 does not start the frequency tracking circuit 410. Accordingly, the oscillator circuit 430 generates the first reference frequency based on the first setting information stored in the register circuit 420 to satisfy the test specification of the first test mode. In the second test mode, if the memory controller 104 detects the data having the first frequency, the memory controller 104 may start the frequency tracking circuit 410 such that the frequency tracking circuit 410 updates the first setting information stored in the register circuit 420 to the second setting information based on the data signal DATA having the second frequency provided by the second testing device 800. In other words, in this example, the second setting information is generated by the operation of frequency tracking, and is stored into the register circuit 420. Therefore, the second reference frequency of the oscillator circuit 430 generated based on the second setting information may satisfy the specification of the second test mode.

Figure 10:
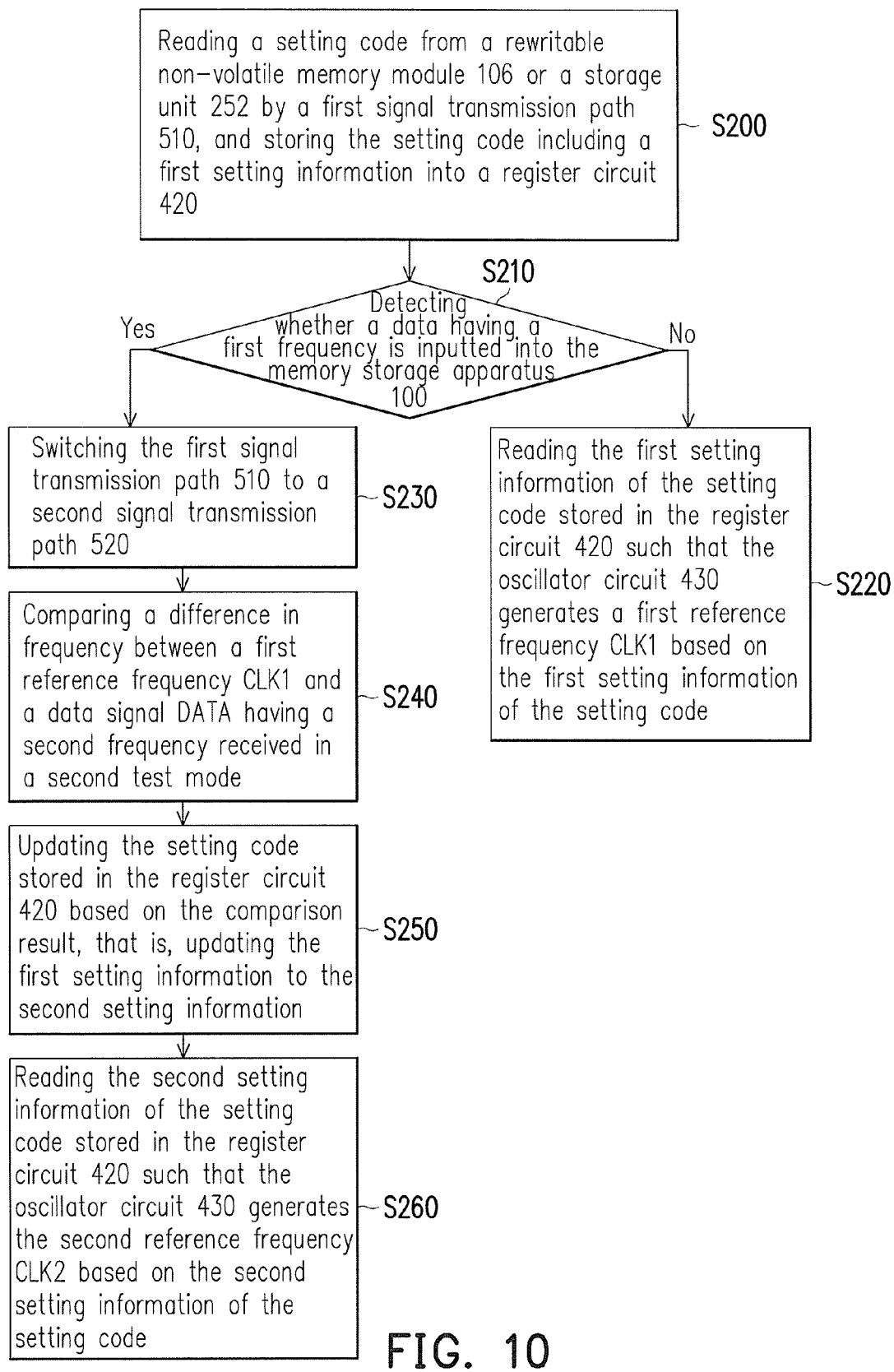
FIG. 10 is a flowchart of a reference frequency setting method illustrated according to another exemplary embodiment of the disclosure.

FIG. 10 is specifically a flowchart of a reference frequency setting method illustrated according to another exemplary embodiment of the disclosure. The reference frequency setting method of the present embodiment is similar to the reference frequency setting method of FIG. 9, and the main difference between the two is, for instance, in step S200, before performing the second test mode or entering normal operation, the setting code is read from the rewritable non-volatile memory module 106 or the storage unit 252 and stored in the register circuit 420 by the first signal transmission path 510. In comparison, the setting code in the embodiment of FIG. 9 only includes the first setting information. Therefore, after performing the second test mode or entering normal operation, in step S240, the frequency tracking circuit 410 compares the difference in frequency between the first reference frequency CLK1 and the data signal DATA having the second frequency received in the second test mode. In step S250, the memory controller 104 updates the setting code stored in the register circuit 420 based on the comparison result of step S240, in other words, the first setting information is updated to the second setting information. Next, in step S260, the memory controller 104 controls the oscillator circuit 430 such that the updated setting code stored in the register circuit 420 is read. Herein, the updated setting code includes the second setting information, such that the oscillator circuit 430 generates the second reference frequency CLK2 based on the second setting information of the setting code.

Moreover, in the present embodiment, after the step S250 of updating the second setting information of the setting code stored in the register circuit 420 is executed, the memory controller 104 may also further store the second setting information of the setting code in the rewritable non-volatile memory module 106 or the storage unit 252 based on the comparison result of step S250.

Moreover, sufficient teaching, suggestion, and implementation illustration of the details of other implementations of the reference frequency setting method of the present embodiment may be obtained from the descriptions of the embodiments of FIG. 1 to FIG. 9, and are not described herein.

Moreover, in the present embodiment, although the setting code stored in the rewritable non-volatile memory module 106 or the storage unit 252 only includes the first setting information, and, in step S250, generates the second setting information by the operation of frequency tracking and then stores the second setting information in the register circuit 420, in order for the memory storage apparatus 100 to satisfy the test specification of the second test mode or to ensure the smooth operation of the memory storage apparatus 100 after entering normal operation, the reference frequency setting method of the present embodiment may also directly store the first setting information that satisfies the test specification of the second test mode in the rewritable non-volatile memory module 106 or the storage unit 252. Moreover, the reference frequency setting method may also directly store the first setting information that may ensure the smooth operation of the memory storage apparatus 100 after entering normal operation. In other words, in this case, the reference frequency generated by the oscillator circuit 430 based on the first setting information may satisfy the test specifications of the first and second test modes, and satisfy the standard of the reference frequency for normal operation.

On the other hand, under normal operation, the memory storage apparatus 100 may, during the open-card process, first store the setting value of the reference frequency in a firmware form in the register circuit 420 by the first signal transmission path 510 so as to be used as the initial frequency value for the next startup. Then, under normal operation, when the memory storage apparatus 100 is connected with the host system 1000, the input signal IN_DATA provided by the host system 1000 may be tracked by the second signal transmission path 520 so as to be used as the setting information of the reference frequency. In this way, the difference between the reference frequency of the oscillator circuit module 400 and the frequency of the host system 1000 is reduced. As a result, the memory storage apparatus 100 may accurately connect with the host system 1000 at startup under normal operation.

Based on the above, in an exemplary embodiment of the disclosure, the memory storage apparatus provides an accurate reference frequency through the host, adjusts the setting code needed for the oscillator circuit module, and stores the setting code into the rewritable non-volatile memory module or the storage unit. Moreover, under different test modes, the memory storage apparatus optionally decides whether to start the function of frequency tracking in order to generate a reference frequency that satisfies different test regulations.

The previously described exemplary embodiments of the present invention have many advantages, including the reference frequency generated by the setting method may satisfy different test specifications, wherein the advantages aforementioned not required in all versions of the invention.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A reference frequency setting method of a rewritable non-volatile memory storage apparatus, wherein the rewritable non-volatile memory storage apparatus comprises a rewritable non-volatile memory module, a storage unit, and an oscillator circuit module, and the oscillator circuit module comprises a register circuit, the rewritable non-volatile memory storage apparatus does not comprise a crystal oscillator, and the reference frequency setting method comprises:

reading a setting code from the rewritable non-volatile memory module or the storage unit by a first signal transmission path, and storing the setting code into the register circuit, wherein the setting code comprises a first setting information;

detecting whether a data having a first frequency is inputted;

if the data having the first frequency is not inputted, reading the setting code stored in the register circuit, such that the oscillator circuit module generates a first reference frequency based on the first setting information of the setting code;

if the data having the first frequency is inputted, updating the setting code stored in the register circuit by a second signal transmission path, wherein the updated setting code comprises a second setting information; and if the data having the first frequency is inputted, reading the updated setting code stored in the register circuit, such that the oscillator circuit module generates a second reference frequency based on the second setting information.

2. The reference frequency setting method according to claim 1, further comprising:

setting the first setting information of the setting code based on a frequency of a host system, and storing the setting code comprising the first setting information into the rewritable non-volatile memory module or the storage unit.

3. The reference frequency setting method according to claim 1, wherein the first reference frequency generated based on the first setting information of the setting code satisfies a specification of a first test mode.

4. The reference frequency setting method according to claim 3, wherein in the first test mode, the rewritable non-volatile memory storage apparatus is coupled to a first testing device, and the first testing device does not output the data having the first frequency to the rewritable non-volatile memory storage apparatus.

5. The reference frequency setting method according to claim 1, wherein if the data having the first frequency is not inputted, the step of updating the setting code stored in the register circuit by the second signal transmission path is not executed by the reference frequency setting method.

6. The reference frequency setting method according to claim 1, further comprising:

setting the second setting information of the setting code based on a frequency of a host system, and storing the setting code comprising the second setting information into the rewritable non-volatile memory module or the storage unit.

7. The reference frequency setting method according to claim 6, wherein in the step of updating the setting code stored in the register circuit by the second signal transmission path, the setting code comprises the second setting information before update.

8. The reference frequency setting method according to claim 1, wherein the second reference frequency generated based on the second setting information of the setting code satisfies a specification of a second test mode.

9. The reference frequency setting method according to claim 8, wherein in the second test mode, the rewritable non-volatile memory storage apparatus is coupled to a second testing device, and the second testing device outputs the data having the first frequency to the rewritable non-volatile memory storage apparatus.

10. The reference frequency setting method according to claim 7, further comprising:

if the data having the first frequency is inputted, switching the first signal transmission path to the second signal transmission path, such that the setting code stored in the register circuit is updated by the second signal transmission path.

11. The reference frequency setting method according to claim 1, wherein the step of updating the setting code stored in the register circuit comprises:

comparing a difference in frequency between the first reference frequency and a data having a second frequency received in a second test mode or a difference in frequency between the second reference frequency and the data having the second frequency received in the second test mode; and updating the second setting information of the setting code stored in the register circuit based on a comparison result.

12. The reference frequency setting method according to claim 11, further comprising:

storing the obtained second setting information of the setting code based on the comparison result into the rewritable non-volatile memory module or the storage unit.

13. A memory controller for setting a reference frequency for a rewritable non-volatile memory storage apparatus, wherein the rewritable non-volatile memory storage apparatus comprises a rewritable non-volatile memory module and an oscillator circuit module, the oscillator circuit module comprises a register circuit, and the memory controller comprises:

a memory interface coupled to the rewritable non-volatile memory module;

a memory management circuit coupled to the memory interface; and a storage unit coupled to the memory management circuit, wherein the memory management circuit controls the oscillator circuit module to read a setting code from the rewritable non-volatile memory module or the storage unit by a first signal transmission path and store the setting code into the register circuit, wherein the setting code comprises a first setting information; the memory management circuit detects whether a data having a first frequency is inputted; if the data having the first frequency is not inputted, the memory management circuit controls the oscillator circuit module to read the setting code stored in the register circuit such that the oscillator circuit module generates a first reference frequency based on the first setting information of the setting code; if the data having the first frequency is inputted, the memory management circuit controls the oscillator circuit module to update the setting code stored in the register circuit by a second signal transmission path, wherein the updated setting code comprises a second setting information; and if the data having the first frequency is inputted, the memory management circuit controls the oscillator circuit module to read the updated setting code stored in the register circuit such that the oscillator circuit module generates a second reference frequency based on the second setting information.

14. The memory controller according to claim 13, wherein if the data having the first frequency is not inputted, the memory management circuit controls the oscillator circuit module not to execute the operation of updating the setting code stored in the register circuit by the second signal transmission path.

15. The memory controller according to claim 13, wherein the oscillator circuit module comprises a frequency tracking circuit located in the second signal transmission path, the frequency tracking circuit is configured to compare a difference in frequency between the first reference frequency and a data having a second frequency received in a second test mode or a difference in frequency between the second reference frequency and the data having the second frequency received in the second test mode, and the oscillator circuit module updates the second setting information of the setting code stored in the register circuit based on a comparison result.

16. The memory controller according to claim 15, wherein the memory management circuit stores the obtained second setting information of the setting code based on the comparison result into the rewritable non-volatile memory module or the storage unit.

17. A rewritable non-volatile memory storage apparatus, comprising:
an oscillator circuit module comprising a register circuit;
a rewritable non-volatile memory module; and
a memory controller coupled to the oscillator circuit module and the rewritable non-volatile memory module, and the memory controller comprises a storage unit,
wherein the memory controller controls the oscillator circuit module to read a setting code from the rewritable non-volatile memory module or the storage unit by a first signal transmission path and store the setting code into the register circuit, wherein the setting code comprises a first setting information; the memory controller detects whether a data having a first frequency is inputted; if the data having the first frequency is not inputted, the memory controller controls the oscillator circuit module to read the setting code stored in the register circuit such that the oscillator circuit module of the rewritable non-volatile memory storage apparatus generates a first reference frequency based on the first setting information; if the data having the first frequency is inputted, the memory controller controls the oscillator circuit module to update the setting code stored in the register circuit is by a second signal transmission path, wherein the updated setting code comprises a second setting information; and if the data having the first frequency is inputted, the memory controller controls the oscillator circuit module to read the updated setting code stored in the register circuit such that the oscillator circuit module generates a second reference frequency based on the second setting information.

18. The rewritable non-volatile memory storage apparatus according to claim 17, wherein if the data having the first frequency is not inputted, the memory controller controls the oscillator circuit module not to execute the operation of updating the setting code stored in the register circuit by the second signal transmission path.

19. The rewritable non-volatile memory storage apparatus according to claim 17, wherein the memory controller sets the second setting information of the setting code based on a frequency of a host system and stores the setting code comprising the second setting information into the rewritable non-volatile memory module or the storage unit.

20. The rewritable non-volatile memory storage apparatus according to claim 19, wherein the setting code comprises the second setting information before update.

21. The rewritable non-volatile memory storage apparatus according to claim 20, wherein if the data having the first frequency is inputted, the memory controller controls the oscillator circuit module to switch the first signal transmission path to the second signal transmission path and update the setting code stored in the register circuit by the second signal transmission path.

22. The rewritable non-volatile memory storage apparatus according to claim 17, wherein the oscillator circuit module comprises a frequency tracking circuit located in the second signal transmission path, the frequency tracking circuit is configured to compare a difference in frequency between the first reference frequency and a data having a second frequency received in a second test mode or a difference in frequency between the second reference frequency and the data having the second frequency received in the second test mode, and the oscillator circuit module updates the second setting information of the setting code stored in the register circuit based on a comparison result.

23. The rewritable non-volatile memory storage apparatus according to claim 22, wherein the memory controller stores the obtained second setting information of the setting code into the rewritable non-volatile memory module or the storage unit based on the comparison result.

* * * * *